(12) United States Patent
Kunda

(10) Patent No.: US 6,848,306 B2
(45) Date of Patent: Feb. 1, 2005

(54) SEMICONDUCTOR DYNAMIC SENSOR

(75) Inventor: Tomohito Kunda, Okazaki (JP)

(73) Assignee: Denso Corporation, Kariya (JP)

( * ) Notice: Subject to any disclaimer, the term of this patent is extended or adjusted under 35 U.S.C. 154(b) by 61 days.

(21) Appl. No.: 09/824,728

(22) Filed: Apr. 4, 2001

(65) Prior Publication Data

US 2001/0055836 A1 Dec. 27, 2001

(30) Foreign Application Priority Data

Jun. 26, 2000 (JP) ........................................ 2000-191535

(51) Int. Cl.$^7$ .......................... G01P 15/00; H01L 29/82
(52) U.S. Cl. ................................. 73/514.01; 73/514.32; 257/420
(58) Field of Search .................... 73/504.09, 504.12, 73/514.32, 514.01, 493, 504.04; 438/114, 115, 118; 156/264; 257/420, 417

(56) References Cited

U.S. PATENT DOCUMENTS

| | | | | |
|---|---|---|---|---|
| 3,869,787 A | * | 3/1975 | Umbaugh | 29/834 |
| 5,843,251 A | * | 12/1998 | Tsukagoshi et al. | 156/64 |
| 5,897,337 A | * | 4/1999 | Kata et al. | 438/114 |
| 6,113,728 A | * | 9/2000 | Tsukagoshi et al. | 156/264 |
| 6,133,637 A | | 10/2000 | Hikita et al. | 257/777 |
| 6,151,966 A | | 11/2000 | Sakai et al. | 73/514.032 |
| 6,245,593 B1 | * | 6/2001 | Yoshihara et al. | 438/106 |
| 6,323,529 B1 | * | 11/2001 | Nagahara | 257/254 |
| 6,448,624 B1 | * | 9/2002 | Ishio et al. | 257/414 |
| 6,568,269 B2 | * | 5/2003 | Nakabayashi | 73/514.32 |

FOREIGN PATENT DOCUMENTS

| | | |
|---|---|---|
| JP | A-63-155676 | 6/1988 |
| JP | A-7-27786 | 1/1995 |
| JP | 8-110351 | 4/1996 |
| JP | A-9-82832 | 3/1997 |
| JP | A-10-197552 | 7/1998 |
| JP | A-10-253654 | 9/1998 |

* cited by examiner

*Primary Examiner*—Hezron Williams
*Assistant Examiner*—Jacques M. Saint-Surin
(74) *Attorney, Agent, or Firm*—Posz & Bethards, PLC

(57) ABSTRACT

A semiconductor dynamic sensor such as an acceleration sensor is composed of a sensor chip having electrodes movable in response to acceleration applied thereto and a circuit chip having a circuit for processing signals fed from the sensor chip. The sensor chip and the circuit chip are contained and held in a packaging case. The sensor chip and the circuit chip are fixedly connected via an adhesive film. The sensor chip is correctly positioned on the circuit chip without creating misalignment relative to a sensing axis, because the adhesive film from which an adhesive material does not flow out under heat is used. A semiconductor wafer including plural sensor chips is first made and the adhesive film is stuck to one surface of the wafer, and then individual sensor chips are separated by dicing. The sensor chip is connected to the circuit chip via the adhesive film.

18 Claims, 6 Drawing Sheets

(Y-AXIS SENSITIVITY) = (X-AXIS SENSITIVITY) × $\sin\theta_1$ (Z-AXIS SENSITIVITY) = (X-AXIS SENSITIVITY) × $\sin\theta_2$

SEMICONDUCTOR DYNAMIC SENSOR

CROSS-REFERENCE TO RELATED APPLICATION

This application is based upon and claims benefit of priority of Japanese Patent Application No. 2000-191535 filed on Jun. 26, 2000, the content of which is incorporated herein by reference.

BACKGROUND OF THE INVENTION

1. Field of the Invention

The present invention relates to a semiconductor dynamic sensor such as an acceleration sensor which includes a semiconductor sensor chip for generating signals according to a dynamic force applied thereto and a substrate for mounting the sensor chip thereon.

2. Description of Related Art

An example of an acceleration sensor is disclosed in JP-A-8-110351. This acceleration sensor includes a semiconductor sensor chip having a movable member for generating a sensor signal according to acceleration applied thereto. The sensor chip is attached and connected to a circuit chip for processing the sensor signal with an adhesive material. The acceleration sensor is made compact in size by laminating the sensor chip on the circuit chip.

However, it is difficult to exactly position the sensor chip on the circuit chip at a predetermined position, because the adhesive has flowability and the sensor chip moves relative to the circuit board during a mounting process including a curing process. If the sensor chip is mis-positioned by being partially lifted up or rotated, the sensitivity of the sensor chip in a predetermined direction decreases.

SUMMARY OF THE INVENTION

The present invention has been made in view of the above-mentioned problem, and an object of the present invention is to provide an improved semiconductor dynamic sensor, in which a sensor chip is correctly mounted on a substrate such as a circuit chip at a predetermined position thereby to prevent a sensitivity decrease in a predetermine direction. Another object of the present invention is to provide a method for manufacturing the improved semiconductor dynamic sensor.

The semiconductor dynamic sensor such as an acceleration sensor is composed of a package case, a semiconductor sensor chip and a circuit chip as a substrate for mounting the sensor chip thereon. The sensor chip and the circuit chip are stuck via an adhesive film and mounted on the package case. The sensor chip includes movable electrodes that are displaced in a sensing direction in response to a dynamic force applied thereto such as acceleration. The circuit chip includes a circuit for processing signals fed from the sensor chip. The adhesive film may be made of either thermosetting or thermoplastic resin.

Plural sensor chips are formed on a semiconductor wafer, and the adhesive film is stuck on a wafer surface that is to be connected to the circuit chip. The wafer is diced into individual sensor chips together with the adhesive film stuck thereto. The individual sensor chip is stuck to a first surface of the circuit board via the adhesive film, and a second surface of the circuit chip is connected to a mounting surface of the package case by means of adhesive. The first surface of the circuit board may be smoothed by coating a resin material thereon. The sensor chip, the circuit chip and the package case are electrically connected by wire-bonding. Wire-bonding pads formed on the circuit chip are not stained with an adhesive material during a curing or transportation process because the sensor chip and the circuit chip are connected by means of the adhesive film.

It is preferable to use an adhesive film having a thickness thinner than 50 $\mu$m and an elasticity coefficient lower than 3,000 MPa to suppress a temperature-dependency of sensor offset outputs within a reasonable range. It is also preferable to partially connect the second surface of the circuit chip to the mounting surface of the package case to eliminate an adverse influence from small depressions or projections on the mounting surface.

According to the present invention, the sensor chip and the circuit board are connected via the adhesive film having no flowability. Therefore, adhesive does not flow out in the curing or transportation process, and the sensor chip is correctly positioned without creating misalignment relative to the sensing axis. Accordingly, a high sensitivity in the sensing axis direction is realized.

Other objects and features of the present invention will become more readily apparent from a better understanding of the preferred embodiment described below with reference to the following drawings.

DETAILED DESCRIPTION OF THE PREFERRED EMBODIMENT

Figure 1:
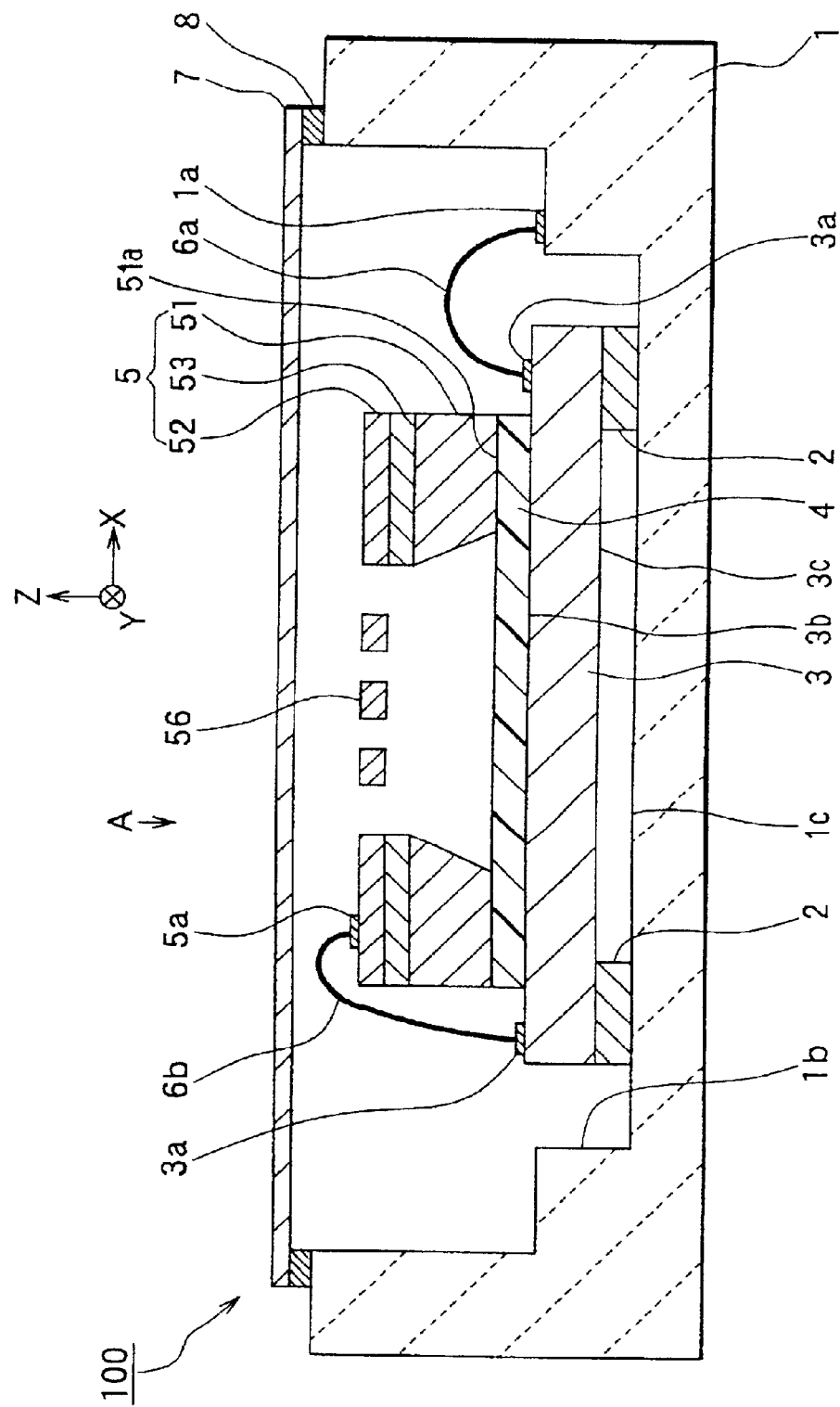
FIG. 1 is a cross-sectional view showing a semiconductor acceleration sensor as an embodiment of the present invention.
Figure 2:
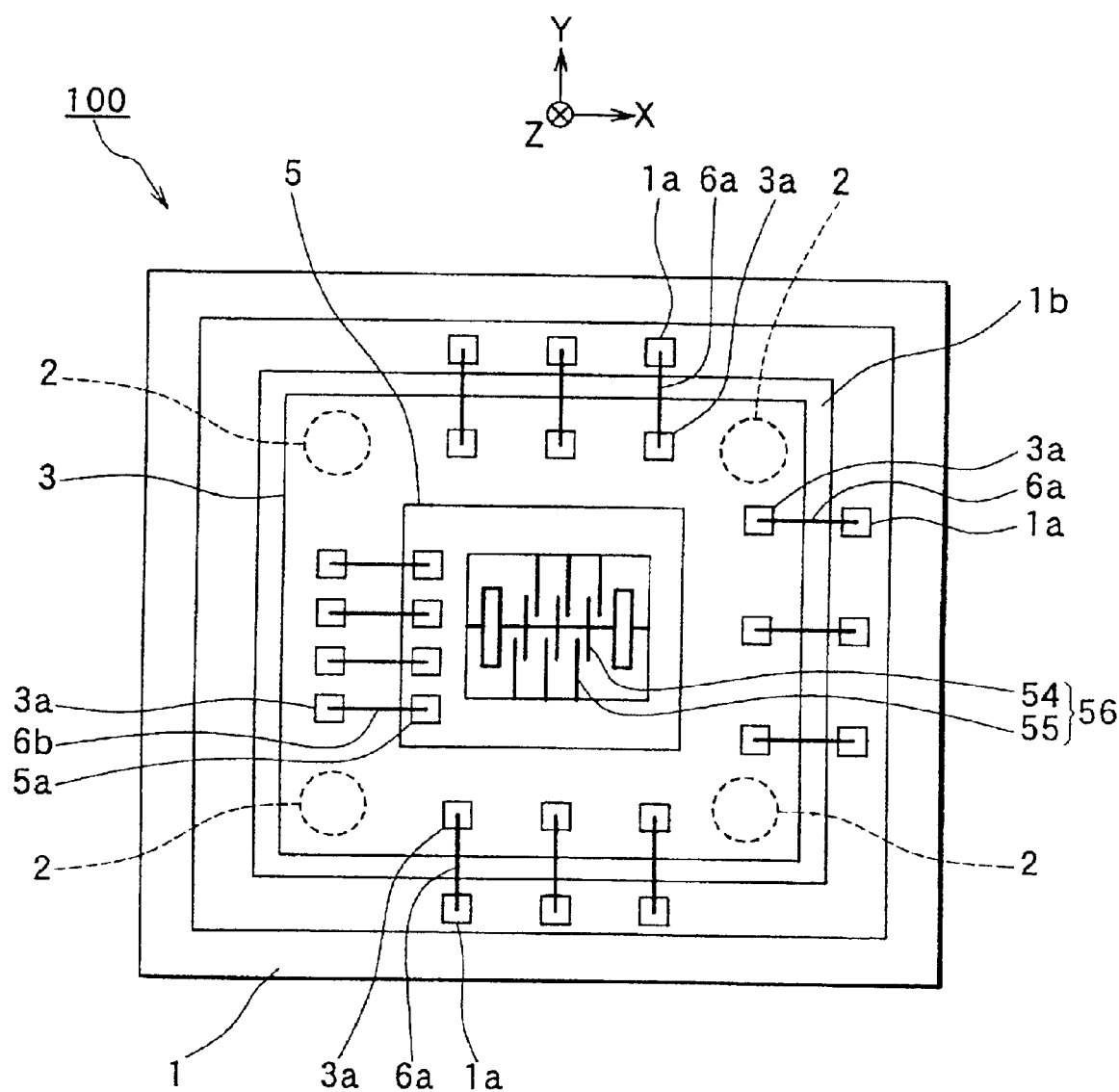
FIG. 2 is a plan view showing the acceleration sensor, viewed in direction A shown in FIG. 1 with a cover plate removed.

An embodiment of the present invention will be described with reference to FIGS. 1 and 2, showing a cross-sectional view and a plan view of an semiconductor acceleration sensor 100, respectively. FIG. 2 shows a plan view viewed in direction A shown in FIG. 1 with a cover plate removed. The acceleration sensor 100 is composed of a semiconductor sensor chip 5 and a substrate 3 both contained in a package case 1.

The package case 1 is made of ceramics, and a cavity 1b for containing the sensor chip 5 and the substrate 3 therein is formed in the package case 1. The substrate 3, which is a semiconductor IC-chip having a circuit for processing sensor signals (referred to as a circuit chip), is mounted on a mounting surface 1c in the cavity 1b via adhesive 2. The semiconductor sensor chip 5 is mounted on the circuit chip 3 via an adhesive film 4. Pads 1a, 3a and 5a made of aluminum or the like for wire-bonding are formed on the package case 1, the circuit chip 3 and the sensor chip 5, respectively. The package case 1 and the circuit chip 3 are electrically connected to each other by wires 6a connecting the pads 1a and 3a. The circuit chip 3 and the sensor chip 5 are electrically connected by wires 6b connecting the pads 3a and 5a. The wires 6a and 6b made of gold, aluminum or the like are formed in a wire-bonding process.

The semiconductor sensor chip 5 is made from an SOI wafer (Silicon-On-Insulator) composed of a first silicon layer 51, a second silicon layer 52 and an oxidized film 53 interposed between both layers 51, 52. The sensor chip 5 includes a beam structure 56 consisting of fixed electrodes and movable electrodes and detects acceleration based on static capacitance changes between the fixed electrodes and the movable electrodes. Since the acceleration sensor chip of this kind is known, its structure will be briefly described below with reference to FIG. 2.

As shown in FIG. 2, the beam structure 56 having comb-shaped fixed electrodes 55 and movable electrodes 54 is formed in the second silicon layer 52. The movable electrodes 54 facing the fixed electrodes 55 displace in direction X shown in FIGS. 1 and 2 when acceleration is imposed on the movable electrodes 54. Static capacitance between the fixed and movable electrodes 54, 55 changes according to the displacement of the movable electrodes 54. Sensor signals representing the capacitance changes are fed from the sensor chip 5 to the circuit chip 3 through the wires 6b and are converted into voltage signals or the like in the circuit chip 3. The converted signals are led to the package case 1 through the wires 6a and are output to outside devices through wires (not shown). Thus, the acceleration is detected as electrical signals.

A surface 51a of the first silicon plate 51 is fixedly connected to a first surface 3b of the circuit chip 3 by means of the adhesive film 4 made of thermosetting or thermoplastic resin such as polyimide or acrylic resin. Preferably, the adhesive film 4 having thickness not exceeding 50 μm (thicker than 15 μm, for example) is used, considering sensor characteristics described later. Further, it is preferable to use the adhesive film 4 having an elasticity coefficient (Young's modulus) equal to or lower than 3,000 MPa (mega pascal). The adhesive film 4 may be either electrically conductive or non-conductive.

While the sensor chip 5 is connected to a first surface 3b of the circuit chip 3 via the adhesive film 4, a second surface 3c of the circuit chip 3 is connected to the mounting surface 1c of the package case 1 via adhesive 2. The circuit chip 3 may be mounted on the package case 1 via the adhesive 2 coated on the entire area of the second surface 3c. However, it is preferable to place the adhesive 2 only on the four corners of the second surface 3c, as shown in FIG. 2.

The opening of the cavity 1b of the package case 1 is closed with a cover plate 7 made of iron or the like to protect the sensor chip 5 and the circuit chip 3 contained in the cavity 1b. The cover plate 7 is fixed to the package case 1 by welding a metal member 8 interposed therebetween.

Now, a process for connecting the sensor chip 5 to the circuit chip 3 and for mounting the circuit chip 3 on the package case 1 will be described with reference to FIGS. 3A–3H. The components constituting the semiconductor dynamic sensor 100 are all shown in cross-sectional views in FIGS. 3A–3H. The pads 1a, 3a and 5a for wire-bonding are not shown in those drawings. A wafer 20 including plural sensor chips therein is manufactured in a known semiconductor manufacturing process, using the SOI substrate.

Figure 3A:
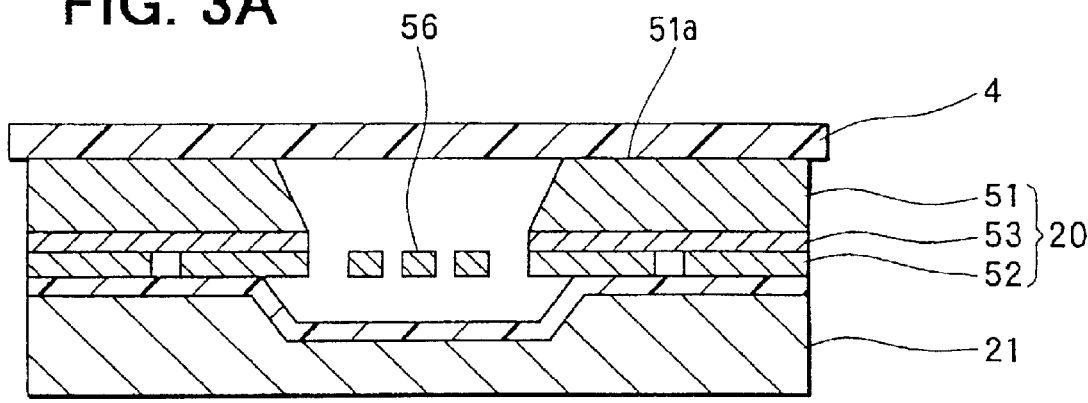
FIGS. 3A–3H are drawings showing a process for assembling the acceleration sensor.

As shown in FIG. 3A, the adhesive film 4 is stuck to the surface 51a of the first silicon layer 51 to cover an entire surface of the wafer 20. The sensor chip surface opposite to the surface 51a is covered with a protective sheet 21 made of resin. Plural depressions corresponding to beam structures 56 of each sensor chip 5 are formed on the protective sheet 21, so that the protective sheet 21 does not contact the beam structures 56.

The adhesive film 4 made of polyimide resin is used in this embodiment. To stick the polyimide adhesive film 4 on the surface 51a of the first silicon layer 51, the wafer 20 is placed on a plate (not shown) heated to about 180° C., placing the surface 51a upward. The adhesive film 4 wound on a roll bobbin (not shown) is spread over the surface 51a, and the adhesive film 4 is stuck to the surface 51a under heat and pressure. Portions of adhesive film 4 hanging over from the surface 51a are cutout. Then, the adhesive film 4 stuck to the wafer 20 is provisionally cured on the heated plate, e.g., for 2 minutes at 180° C. Then the protective sheet 21 is stuck on the surface opposite to the surface 51a. Thus, both surfaces of the wafer 20 are covered with the adhesive film 4, and the protective sheet 21, respectively, as shown in FIG. 3A.

Figure 3B:
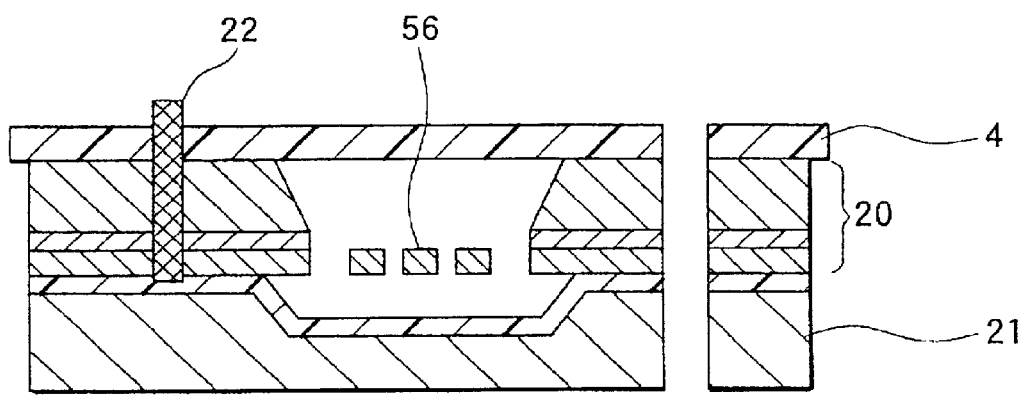
Figure 3C:
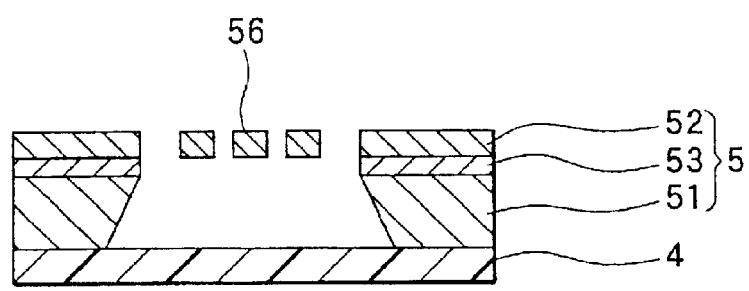

Then, as shown in FIG. 3B, the wafer 20 is cutout into individual sensor chips 5 together with the adhesive film 4 and the protective sheet 21 by a dicing cutter 22. Then, the protective sheet 21 is removed, while keeping the adhesive film 4 on the surface 51a. Thus, the sensor chip 5 having the adhesive film 4 attached thereto is completed, as shown in FIG. 3C.

Figure 3D:
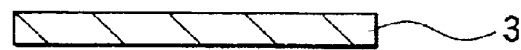
Figure 3E:
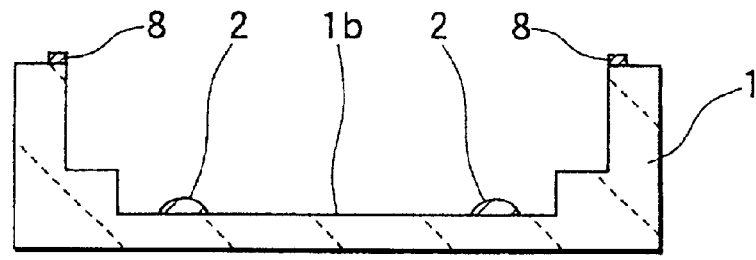
Figure 3F:
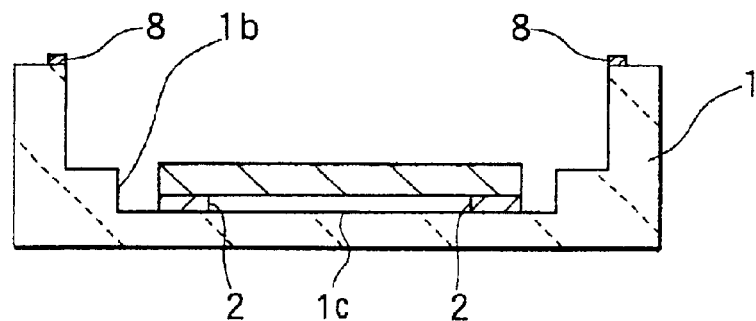

On the other hand, as shown in FIGS. 3D–3F, the circuit chip 3 is mounted on the package case 1 by means of adhesive 2. The adhesive 2 is placed at desired positions, e.g., at four corners, on the mounting surface 1c of the package case 1, as shown in FIG. 3E. Then, the circuit chip 3 is bonded to the package case 1 with the adhesive 2, as shown in FIG. 3F.

Figure 3G:
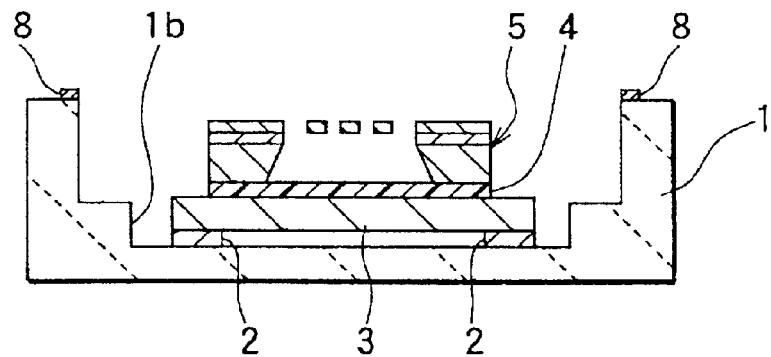

Then, as shown in FIG. 3G, the sensor chip 5 is bonded to the circuit chip 3 with the adhesive film 4 interposed therebetween. This process will be described in detail, assuming the adhesive film 4 is made of polyimide resin. The package case 1 on which the circuit chip 3 is mounted is placed on an assembling plate (not shown) heated to about 230° C. The sensor chip 5 is placed on the circuit chip 3, so that the adhesive film 4 contacts the circuit chip 3. The sensor chip 5 is bonded to the circuit chip 3 via the adhesive film 4 under heat and pressure, e.g., at a temperature of 230° C. and under a pressure of 3 N (newton) Then, the adhesive film 4 is finally cured in an oven for about one hour at about 190° C.

Figure 3H:
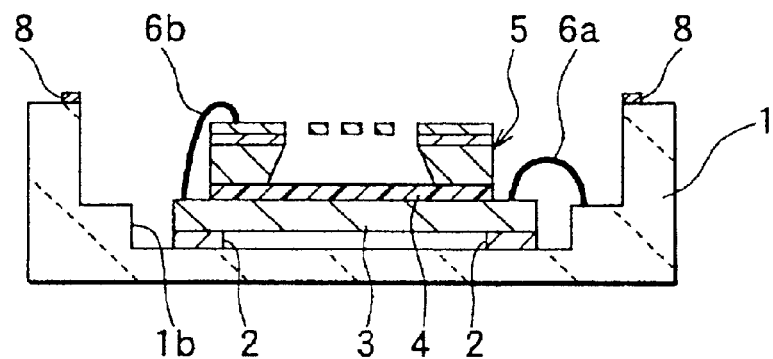

Then, as shown in FIG. 3H, the pads 1a, 3a, 5a are electrically connected through wires 6a, 6b by wire-bonding. Finally, the cover plate 7 is connected to the package case 1 to close the opening by welding, e.g., by seam-welding. The metal member 8 for welding is bonded or soldered to the package case 1 before the process of mounting the components thereon. Thus, the semiconductor acceleration sensor 100 shown in FIG. 1 is completed. The acceleration sensor 100 is mounted, for example, on an electronic control unit for use in an automobile to detect acceleration.

Since the adhesive film 4 that has no flowablity is used for fixing the sensor chip 5 to the circuit chip 3 in the embodiment described above, the sensor chip 5 is correctly mounted at a predetermined position on the circuit chip 3. If a liquid adhesive having flowability is used as in the conventional device, the sensor chip 5 cannot be fixed to the circuit chip 5 at a correct position, because the sensor chip 5 will move relative to the circuit chip 3 in a sticking process or during a process of transporting the device into an oven to cure the adhesive. In other words, misalignment of the sensor chip 5 is avoided in the embodiment of the present invention, and thereby the sensor sensitivity in directions other than in a predetermined direction (referred to as the other axis sensitivity) can be made almost zero.

Figure 4A:
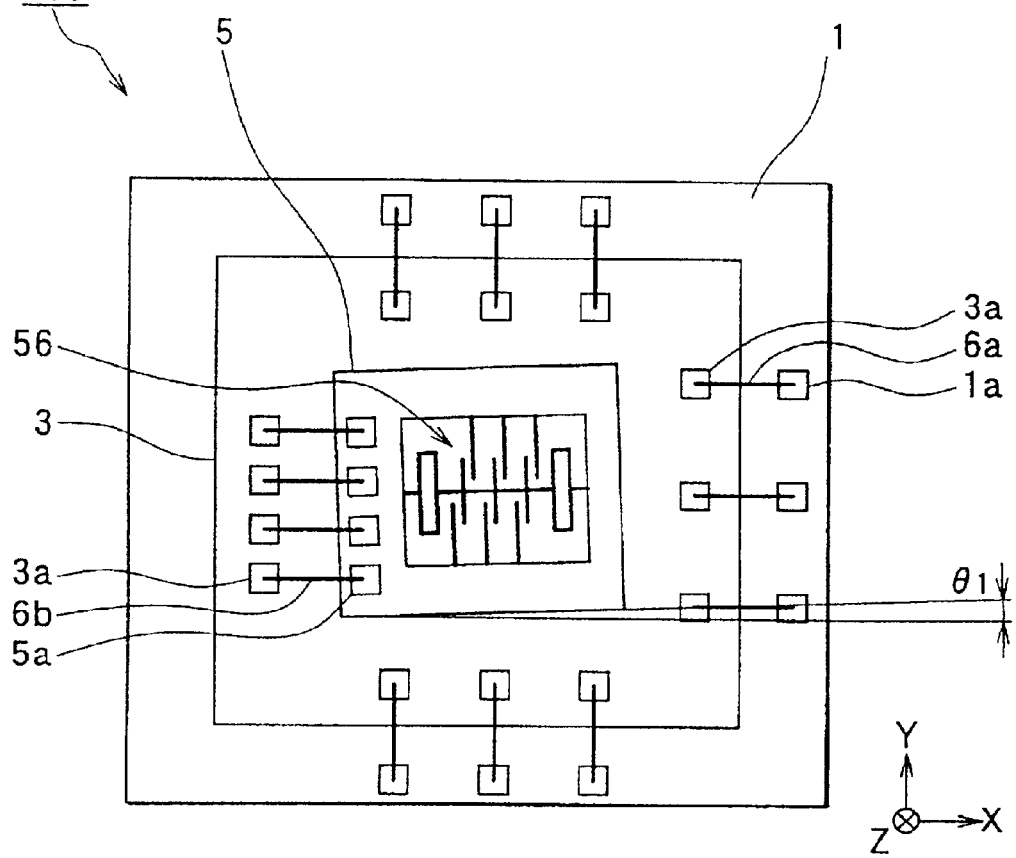
FIG. 4A is a plan view showing an acceleration sensor as a comparative example, in which a sensor chip is mounted on a circuit chip with a horizontal misalignment angle θ1.
Figure 4B:
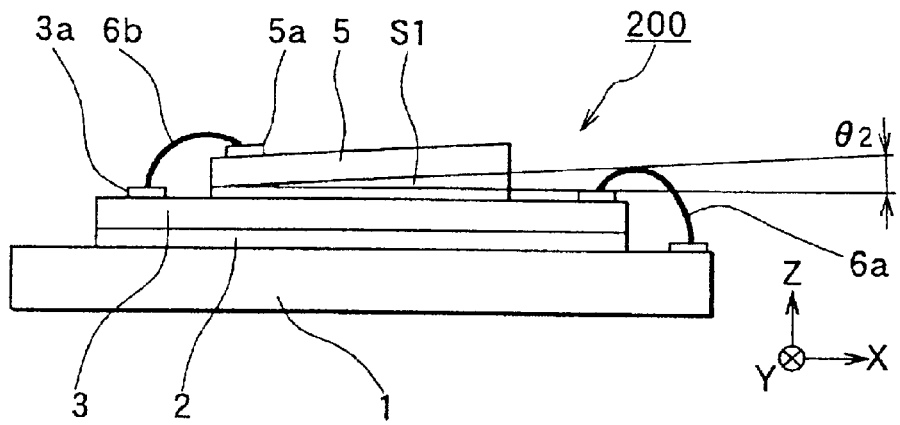
FIG. 4B is a side view showing the acceleration sensor shown in FIG. 4A, in which the sensor chip is mounted on the circuit chip with a vertical misalignment angle θ2.

The other axis sensitivity mentioned above will be further explained with reference to FIGS. 4A and 4B showing a comparative example 200 in which a liquid adhesive S1 is used for mounting the sensor chip 5 on the circuit chip 3. The reference numbers shown in FIGS. 4A and 4B are the same as those of the embodiment of the present invention. As mentioned above, acceleration is detected based on a displacement of the movable electrodes 54 of the beam structure 56 in the X-axis direction (X, Y and Z axes are shown in FIGS. 4A and 4B). The sensor chip 5 has to be positioned, so that the movable electrodes 54 moves in the X-axis direction and the beam structure plane becomes in parallel to the mounting surface 1c of the package case 1.

If the sensor chip 5 is misaligned relative to the circuit chip 3 with an misalignment angle $\theta 1$ in the X-Y plane as shown in FIG. 4A, the following sensitivity appears in the direction of Y-axis:

(Y-axis sensitivity)=(X-axis sensitivity)×(sin $\theta 1$)

If the sensor chip 5 is misaligned with an misalignment angle $\theta 2$ in the Z-axis direction as shown in FIG. 4B, the following sensitivity appears in the direction of Z-axis:

(Z-axis sensitivity)=(X-axis sensitivity)×(sin $\theta 2$)

It is, of course, intended to have the sensor sensitivity only in the X-axis direction. If there appears some sensitivity in other axis directions than X-axis direction, the X-axis sensitivity decreases by the amount of the other axis sensitivity.

Since the other axis sensitivity is eliminated or is made almost zero by using the adhesive film 4 having no flowability in the embodiment of the present invention, an intended high sensitivity in the X-axis direction can be obtained. Further, the pads 3a on the circuit chip 3 are prevented from being stained with liquid adhesive flowing over the pads 3a. Accordingly, the bonding strength is not adversely affected by the adhesive material.

As mentioned above, the preferable thickness of the adhesive film 4 is less than 50 $\mu$m, and its preferable elasticity coefficient (Young's modulus) is lower than 3,000 MPa. The reasons for those will be explained with reference to FIGS. 5 and 6 showing simulation test results.

Figure 5:
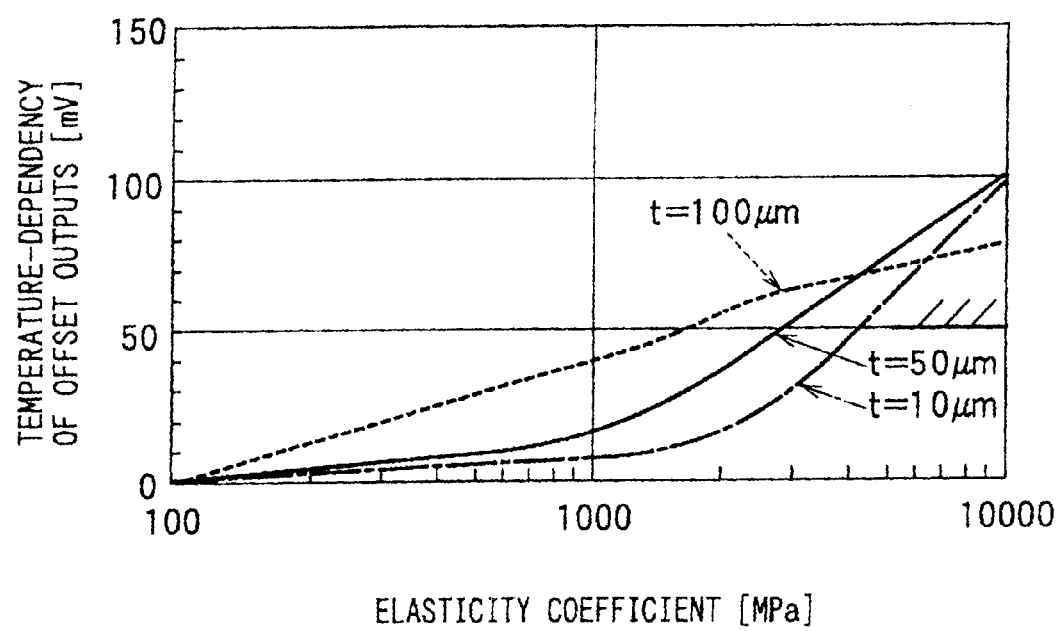
FIG. 5 is a graph showing a relation between elasticity coefficient of an adhesive film and temperature-dependency of sensor offset outputs.

In FIG. 5, the temperature-dependency of sensor offset outputs (in terms of mV) is plotted on the ordinate versus the elasticity coefficient (in terms of MPa) of the adhesive film 4 on the abscissa. The temperature-dependency of sensor offset outputs means a sensor output difference between two ambient temperature levels, 25° C. and 85° C. when no acceleration is imposed on the sensor. According to experiments by the applicant, it is preferable in a practical use that the temperature-dependency does not exceed 50 mV. The temperature-dependency for three adhesive films 4, each having different thickness, t=10, 50 and 100 $\mu$m, is shown in the graph of FIG. 5. As seen in the graph, the thicker the adhesive film is, the larger the temperature-dependency becomes.

Figure 6:
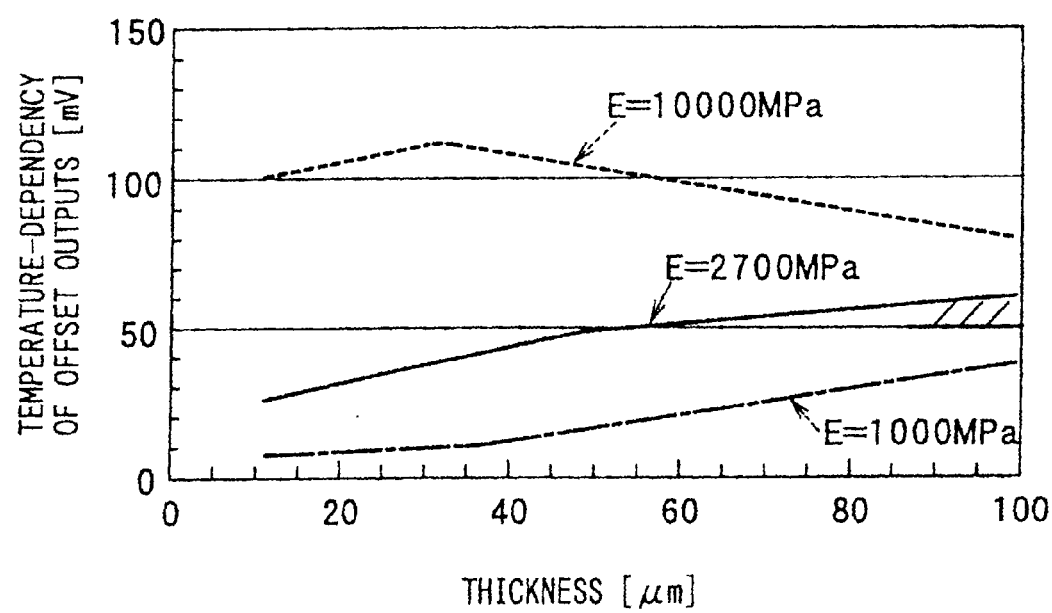
FIG. 6 is a graph showing a relation between thickness of the adhesive film and the temperature-dependency of sensor offset outputs.

In FIG. 6, a relation between the temperature-dependency of sensor offset outputs and the thickness of the adhesive film 4 is shown, taking the elasticity coefficient as a parameter. As seen in the graph, the lower the elasticity, the lower the temperature characteristic. Combining both results shown in FIGS. 5 and 6, it is seen that the condition, under which the temperature-dependency of the offset outputs does not exceed 50 mV, is satisfied if the adhesive film thickness is thinner than 50 $\mu$m and its elasticity coefficient is lower than about 3,000 MPa.

Since the adhesive film 4 is stuck to the wafer 20 that includes plural sensor chips 5, and the wafer 20 is separated into individual sensor chips 5 by dicing, it is not necessary to stick the adhesive film to individual sensor chips 5. Therefore, the manufacturing process is considerably simplified. It is preferable to smooth the mounting surfaces, i.e., the first surface 3b of the circuit chip 3 on which the sensor chip 5 is mounted and the mounting surface 1c of the package case 1 on which the circuit chip 3 is mounted. It may be necessary to remove the mounting surface inclination relative to the X-Y plane before mounting the sensor chip 5, if there is such inclination.

Since the circuit chip 3 is mounted on the mounting surface 1c by applying the adhesive 2 only to some portions of the mounting surface 1c, e.g., only to its four corners, the circuit chip 3 can be mounted flat on that surface without being affected by possible small depressions or projections on that surface. Since the adhesive film 4 stuck to the sensor chip 5 is heated to soften the same to a degree not to generate its flowabilty in the process of mounting the sensor chip 5 on the first surface 3b of the circuit chip 3, small depressions or projections on that surface can be absorbed by the softened adhesive film 4. The first surface 3b may be smoothed by coating resin such as polyimide (PIQ) thereon to enhance a close contact between the sensor chip 5 and the circuit chip 3.

The semiconductor sensor chip is not limited to the sensor chip having a beam structure 56 including movable electrodes 54, but other sensor elements generating electrical signals according to applied acceleration, such as a piezoelectric elements, may be used. Further, elements other than the circuit chip 3, such as a glass substrate, may be used as the substrate on which the sensor chip 5 is mounted. The present invention is also applicable to other sensor devices such as angular velocity sensors.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor dynamic sensor comprising:
    a semiconductor sensor chip having a member movable according to a dynamic force applied thereto, the semiconductor sensor chip outputting a sensor signal in response to an amount of movement of the movable member, the movable member being provided on one surface of the semiconductor sensor chip; and
    a substrate for mounting and supporting the semiconductor sensor chip thereon,
    wherein the other surface of the semiconductor sensor chip is connected to the substrate via an adhesive film.

2. The semiconductor dynamic sensor as in claim 1, further including a package case, wherein:
    the substrate is a semiconductor chip having a circuit for processing the sensor signal;
    the semiconductor sensor chip is connected to a first surface of the semiconductor chip having the processing circuit; and a second surface of the semiconductor chip having the processing circuit is partially connected to the package case.

3. The semiconductor dynamic sensor as in claim 1, wherein:
the adhesive film is made of a thermosetting resin or a thermoplastic resin.

4. The semiconductor dynamic sensor as in claim 3, wherein:
a thickness of the adhesive film is less than 50 µm.

5. The semiconductor dynamic sensor as in claim 3, wherein:
an elasticity coefficient of the adhesive film is less than 3,000 mega Pascals.

6. The semiconductor dynamic sensor as in claim 1, wherein:
the semiconductor sensor chip is a sensor chip for sensing acceleration.

7. A semiconductor dynamic sensor, comprising:
a substrate;
a sensor chip, including a movable member for sensing a dynamic force applied thereto, for generating sensor signals proportional to an amount of movement of the movable member, the movable member being provided on one surface of the sensor chip; and
a film located between the substrate and the sensor chip for bonding the other surface of the sensor chip with a surface of the substrate.

8. The semiconductor dynamic sensor of claim 7, wherein the substrate comprises a circuit chip electrically connected to the sensor chip for processing the sensor signals generated by the sensor chip.

9. The semiconductor dynamic sensor of claim 7, wherein the film comprises one of a thermosetting and a thermoplastic resin film.

10. A semiconductor dynamic sensor comprising:
a substrate;
a sensor chip having a first surface and a second surface, the sensor chip including a movable member provided on the first surface for sensing a dynamic force applied thereto and for generating sensor signals in response to movement of the movable member; and
an adhesive film located between the substrate and the second surface of the sensor chip for bonding the second surface of the sensor chip with a surface of the substrate.

11. The semiconductor dynamic sensor as in claim 10, further including a package case, wherein:
the substrate is a semiconductor chip having a processing circuit for processing the sensor signals;
the sensor chip is connected to a first surface of the semiconductor chip having the processing circuit; and
a second surface of the semiconductor chip having the processing circuit is partially connected to the package case.

12. The semiconductor dynamic sensor as in claim 10, wherein the adhesive film is made of a thermosetting resin or a thermoplastic resin.

13. The semiconductor dynamic sensor as in claim 12, wherein a thickness of the adhesive film is less than 50 µm.

14. The semiconductor dynamic sensor as in claim 12, wherein an elasticity coefficient of the adhesive film is less than 3,000 mega Pascals.

15. A semiconductor dynamic sensor comprising:
a substrate;
a sensor chip having a first surface and a second surface and including a movable member provided on the first surface for sensing a dynamic force applied thereto and for generating sensor signals in response to movement of the movable member; and
an adhesive film located between the substrate and the second surface of the sensor chip for bonding the second surface of the sensor chip with a surface of the substrate, wherein
the adhesive film is made of a thermosetting resin or a thermoplastic resin and provides a temperature-dependency of sensor offset outputs that is less than or equal to 50 mV.

16. The semiconductor dynamic sensor as in claim 10, wherein the sensor chip is for sensing acceleration.

17. The semiconductor dynamic sensor as in claim 15, wherein a thickness of the adhesive film is less than 50 µm.

18. The semiconductor dynamic sensor as in claim 15, wherein an elasticity coefficient of the adhesive film is less than 3,000 mega Pascals.

* * * * *